(12) United States Patent
 Umeki

(10) Patent No.: US 8,405,282 B2
(45) Date of Patent: Mar. 26, 2013

(54) PIEZOELECTRIC DEVICES EXHIBITING ENHANCED RESISTANCE TO PHYSICAL IMPACTS AND MOISTURE INCURSION

(75) Inventor: Mitoshi Umeki, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 138 days.

(21) Appl. No.: 13/117,600

(22) Filed: May 27, 2011

(65) Prior Publication Data

US 2011/0291528 A1    Dec. 1, 2011

(30) Foreign Application Priority Data

May 28, 2010  (JP) ................. 2010-122290

(51) Int. Cl.
*H01L 41/08* (2006.01)
(52) U.S. Cl. ........................................ 310/344
(58) Field of Classification Search ............ 310/344
See application file for complete search history.

(56) References Cited

U.S. PATENT DOCUMENTS

| 3,931,388 | A * | 1/1976 | Hafner et al. | 310/344 |
| 8,089,200 | B2 * | 1/2012 | Kawahara | 310/344 |
| 8,212,453 | B2 * | 7/2012 | Kohda | 310/344 |
| 2005/0104480 | A1 | 5/2005 | Tanaya | |
| 2011/0068659 | A1 * | 3/2011 | Ichikawa | 310/344 |
| 2011/0215678 | A1 * | 9/2011 | Kohda et al. | 310/344 |
| 2011/0227457 | A1 * | 9/2011 | Ishikawa et al. | 310/344 |

FOREIGN PATENT DOCUMENTS

| JP | H04-023326 Y2 | 2/1992 |
| JP | 2005-026411 | 1/2005 |
| JP | 2008-066885 | 3/2008 |

OTHER PUBLICATIONS

Office Action for related Japanese Patent Application No. 2010-122290, 3 pages, Jul. 25, 2012 (in Japanese).

* cited by examiner

*Primary Examiner* — Mark Budd
(74) *Attorney, Agent, or Firm* — Klarquist Sparkman, LLP

(57) ABSTRACT

An exemplary piezoelectric vibrating device includes a piezoelectric vibrating piece that vibrates when electrically energized, a first package plate, and a second package plate. The first package plate has a respective inner main surface defining a recess. The recess has volume and dimensions sufficient to contain at least a portion of the piezoelectric vibrating piece. The inner main surface includes a peripheral main surface that peripherally extends around the recess. The second package plate has respective inner and outer main surfaces. The inner main surface is bonded to the peripheral main surface of the first package plate using a sealing material that thus seals the piezoelectric vibrating piece inside a package formed of the first and second package plates. The sealing material includes multiple concentric bands of sealing glass and multiple concentric bands of adhesive. The sealing-glass bands and the adhesive bands circumscribe the recess and desirably are in alternating order from in to out to provide durable seals.

16 Claims, 11 Drawing Sheets

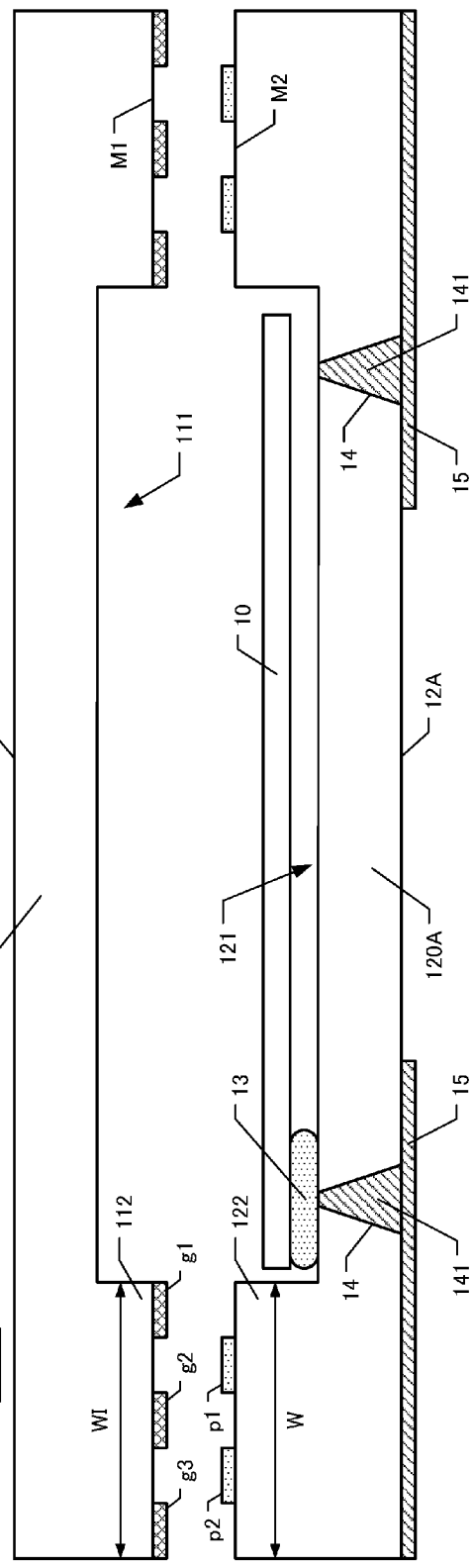
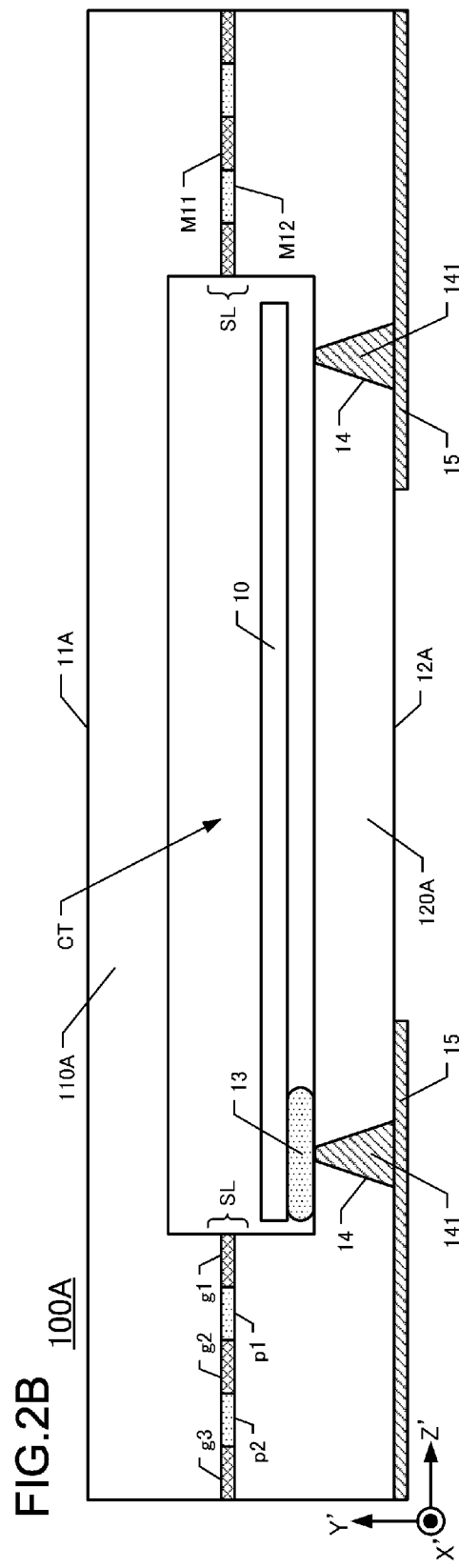

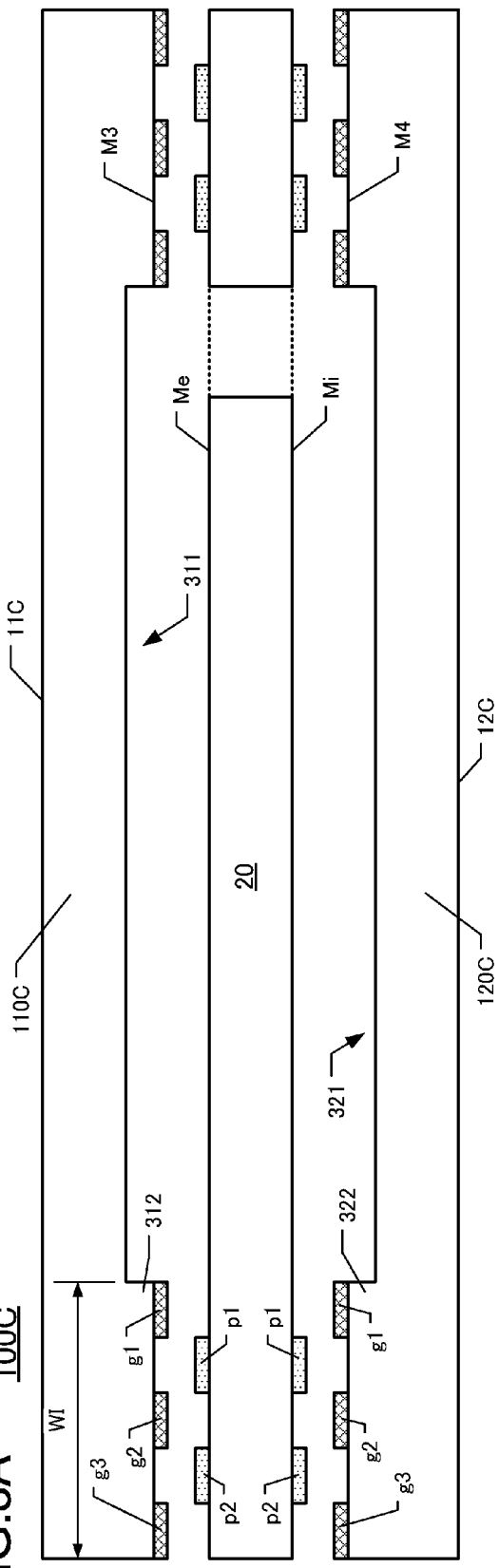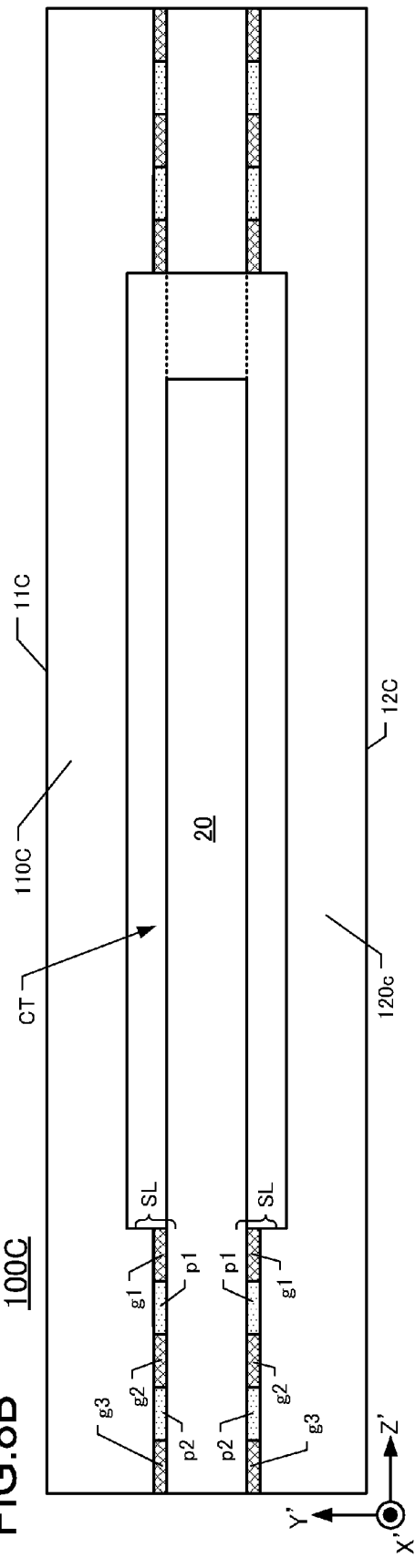

PIEZOELECTRIC DEVICES EXHIBITING ENHANCED RESISTANCE TO PHYSICAL IMPACTS AND MOISTURE INCURSION

CROSS-REFERENCE TO RELATED APPLICATION

This application claims priority to and the benefit of Japan Patent Application No. 2010-122290, filed on May 28, 2010, in the Japan Patent Office, the disclosure of which is incorporated herein by reference in its entirety.

FIELD

This disclosure pertains to, inter alia, piezoelectric devices having an AT-cut piezoelectric vibrating piece set that vibrates in the thickness-shear vibration mode or a tuning-fork type piezoelectric vibrating piece having a pair of vibrating arms contained within a cavity defined by a package. This disclosure also pertains to methods for manufacturing such devices.

DESCRIPTION OF THE RELATED ART

Some types of surface-mountable piezoelectric devices are sealed within a "package" using sealing glass. This packaging scheme is economically efficient in that it does not involve seam welding. Piezoelectric devices sealed using sealing glass are of particular usefulness in vehicle-mounting environments characterized by relatively high humidity and temperature as well as vibrations and physical impacts.

Japan Unexamined Patent Publication No. 2005-026411 discusses piezoelectric devices that are glass-sealed. In a characteristic piezoelectric device as disclosed in this reference, the periphery of the upper (inner) main surface of its package base is coated with sealing glass. Also coated with sealing glass are side portions of the package base except the corners thereof. Then, a lid is joined to the sealing glass to form the package.

Unfortunately, the piezoelectric devices as disclosed in the JP '411 reference are less resistant to physical impacts than devices in which the packages are sealed using a cured resin. I.e., glass is a fragile material; hence, a glass seal is more likely to be damaged or destroyed upon receiving a physical impact. In other words, a lid attached to a package base only by a glass seal is vulnerable to detachment from the package base due to physical impacts. Other conventional methods utilize an adhesive (typically a cured resin) sealing to attach the lid to the package base. Unfortunately, many adhesives allow atmospheric moisture to enter the package across the adhesive and thus cannot maintain a desired vacuum condition inside the package. Consequently, resin sealing is unsuitable for piezoelectric devices used in environments having relatively high temperature and humidity.

SUMMARY

In view of the foregoing, this invention provides, inter alia, piezoelectric devices in which a first package plate and a second package plate are bonded together using both adhesive and sealing glass to obtain excellent bonding strength and to maintain a desired vacuum level and/or specified humidity inside the package. Example first and second package plates are a package base and package lid, respectively.

According to a first aspect, piezoelectric devices are provided. An embodiment of such a device comprises a piezoelectric vibrating piece that vibrates whenever a proper voltage signal is applied thereto (i.e., whenever appropriately energized electrically). The device also comprises a first package plate defining a recess providing a void for accommodating at least a portion of the piezoelectric vibrating piece inside the package. Surrounding the recess is a peripheral main surface. The package also includes a second package plate having an inner main surface that is bonded to the peripheral main surface of the first package plate, using a sealing material. Thus, the two package plates are bonded together to form a package in which the piezoelectric vibrating piece is sealed. The sealing material includes respective concentric bands of sealing glass and adhesive. Respective bands are applied to the peripheral main surface of the first package plate and to the inner main surface of the second package plate.

The bands of sealing glass and of adhesive desirably are arranged so that they circumscribe the recess and are disposed alternatingly as respective bands with increased distance from the recess outward. Desirably, the band disposed nearest the recess is a band of sealing glass.

Another embodiment of a piezoelectric device comprises a piezoelectric plate comprising a piezoelectric vibrating piece that vibrates whenever an appropriate voltage is applied to it (i.e., when electrically energized) and further comprises a frame body formed integrally with the piezoelectric vibrating piece so as to surround the piezoelectric vibrating piece while providing first and second main surfaces. A first package plate is bonded to the first main surface of the frame body using a first sealing material. A second package plate is bonded to the second main surface of the frame body using a second sealing material, thereby sandwiching the frame body between the first and second package plates. Thus, the piezoelectric vibrating piece is enclosed within a package comprising the frame body and the first and second package plates. The first sealing material comprises multiple bands of sealing glass and multiple bands of adhesive. These bands extend concentrically peripherally around the periphery of the first main surface. The second sealing material comprises multiple bands of sealing glass and multiple bands of adhesive that extend peripherally on the second main surface.

The respective bands of sealing glass and of adhesive constituting the first sealing material desirably are disposed on the first main surface of the frame body in alternating order from inward (nearest the piezoelectric vibrating piece) to outward. In a similar manner, the respective bands of sealing glass and of adhesive constituting the second sealing material desirably are disposed on the second main surface (opposite to the first main surface) of the frame body.

In the inside-to-outside arrangement of the respective bands of sealing glass and of adhesive, the band on the frame body nearest the piezoelectric vibrating piece in the first and second sealing materials desirably is a band of sealing glass.

According to another aspect of the invention, piezoelectric devices are provided, in which the adhesive is a polyimide resin having a curing temperature in the same temperature range as the melting temperature of the sealing glass.

In some embodiments of piezoelectric devices, the sealing glass is a low-melting-temperature glass of which the melting point is lower than the respective melting points of the first and second plates.

In some embodiments piezoelectric devices are provided in which there is a gap, containing no sealing glass or adhesive, located on the main surface between a band of sealing glass and a band the adhesive.

In another embodiment each respective band of sealing glass and adhesive is formed by photolithography.

Piezoelectric devices according to the invention exhibit substantially reduced incursion of atmospheric moisture from outside to inside the package. These devices also prevent loss of the vacuum atmosphere from inside the device. The embodiments also provide high bonding strength between the first plate and second plate.

BRIEF DESCRIPTION OF THE DRAWINGS

FIG. 2A is an elevational section of the first embodiment, including a quartz-crystal vibrating piece, before a package lid and a package base are bonded together to enclose the quartz-crystal vibrating piece.

FIG. 2B is an elevational section of the first embodiment after the package lid and package base have been bonded together.

FIG. 8A is an elevational section of the third embodiment of a quartz-crystal vibrating device before the package lid, a quartz-crystal frame, and the package base are bonded together.

FIG. 8B is an elevational section of the third embodiment of a quartz-crystal vibrating device after bonding together the package lid, the quartz-crystal frame, and the package base.

DETAILED DESCRIPTION

Various embodiments are described in detail below, with reference to the accompanying drawings. It will be understood that the invention is not limited to the described embodiments.

In the described embodiments, an AT-cut quartz-crystal vibrating piece is used as the piezoelectric vibrating piece. An AT-cut quartz crystal vibrating piece has a principal surface (in the YZ plane) that is tilted by 35° 15' about the Y-axis of the crystal coordinate system (XYZ) in the direction of the Y-axis from the Z-axis around the X-axis. Thus, in the following description, new axes tilted with respect to the axial directions of the quartz-crystal vibrating piece are denoted as the X'-axis, Y'-axis, and Z'-axis, respectively. Regarding a height in the Y'-axis direction, a positive (+) direction is denoted as high and a negative (−) direction is denoted as low.

First Representative Embodiment

Figure 1:
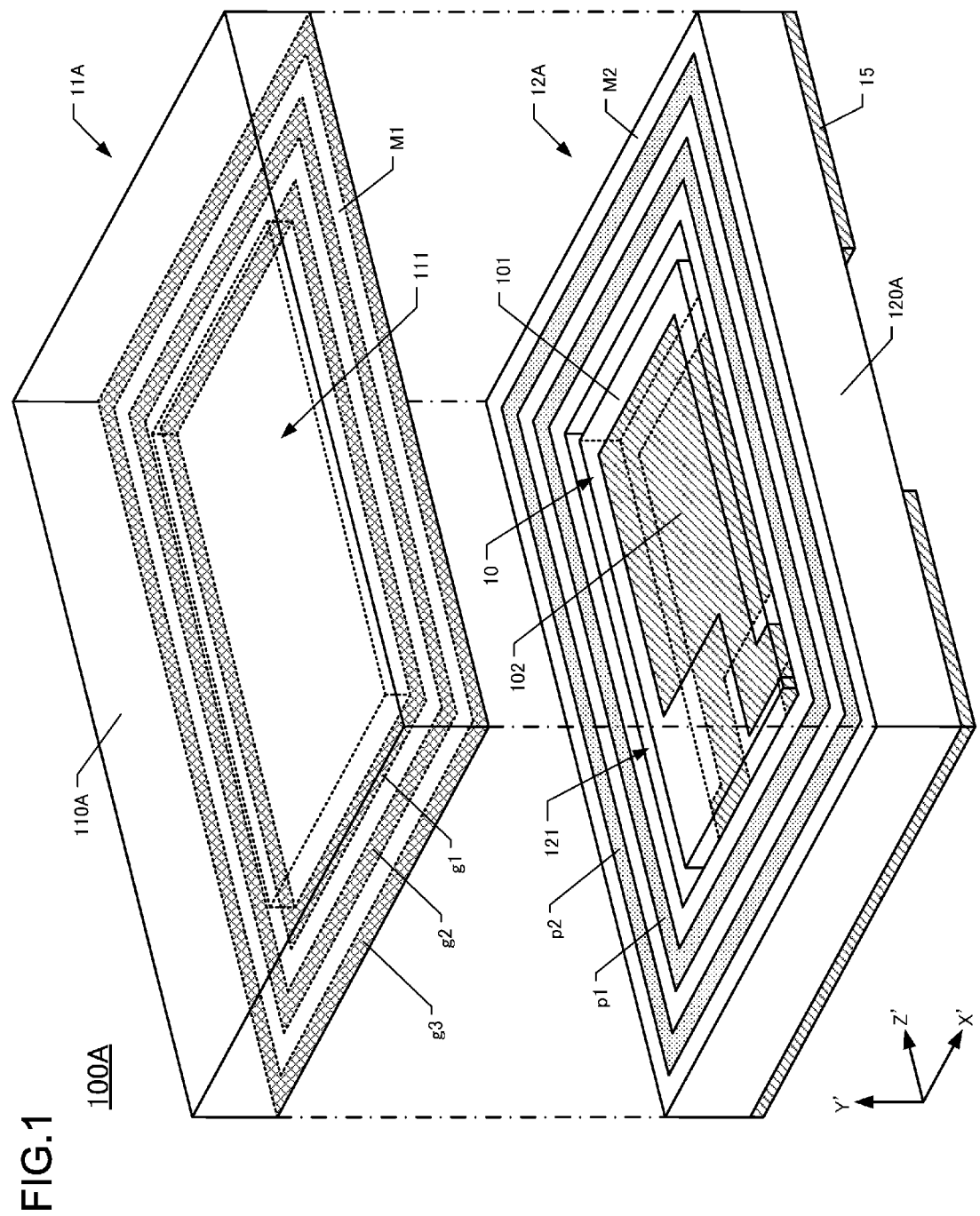
FIG. 1 is an exploded perspective view of a first embodiment of a quartz-crystal vibrating device.

This embodiment is shown in FIGS. 1 and 2A-2B. FIG. 1 is an exploded perspective view of the quartz-crystal vibrating device 100A of this embodiment. FIG. 2A is an elevational section of the quartz-crystal vibrating device 100A before a package lid 11A and a package base 12A (between which a quartz-crystal vibrating piece is sandwiched) are bonded together. FIG. 2B is an elevational section of this embodiment 100A after the package lid 11A and package base 12A have been joined together.

As shown in FIG. 1, the quartz-crystal vibrating device 100A includes a package lid 11A having an inner main surface defining a lid recess 111. The quartz-crystal vibrating device 100A also includes a package base 12A having an inner main surface defining a base recess 121. A quartz-crystal vibrating piece 10 is mounted in the base recess 121 to the package base 12A.

The quartz-crystal vibrating piece 10 comprises a quartz-crystal piece 101 and a pair of excitation electrodes 102. The excitation electrodes 102 are disposed in middle regions of respective main surfaces of the quartz-crystal piece 101 so as to oppose each other across the thickness of the quartz-crystal piece 101. As shown in FIGS. 2A and 2B, the quartz-crystal piece 10 is bonded to the package base 12A using electrically conductive adhesive 13. The excitation electrodes 102 are connected to respective external electrodes 15, formed on the lower main surface of the package base A, using the conductive adhesive 13 and respective connecting electrodes 141 formed on the interior surfaces of respective through-holes 14 in the package base 12A. Whenever the external electrodes 15 are connected to respective output terminals of an external power source (not shown), both main surfaces of the quartz-crystal vibrating piece 10 exhibit thickness-shear vibration in which the surfaces move in mutually opposite directions. The quartz-crystal vibrating piece 10 vibrates at several MHz to several hundred MHz, depending upon the thickness across the main surfaces thereof.

The package lid 11A is fabricated from a lid 110A formed of a piezoelectric material such as quartz crystal or glass. The inner main surface of the package lid 11A defines a recess 111 and a peripheral main surface M1 surrounding the recess 111. The peripheral main surface M1 is situated atop a protruding portion 112. As the protruding portion 112 surrounds the recess 111, the peripheral main surface M1 has a width WI. Respective bands g1, g2, g3 of sealing glass, each having a width of WI/5, are formed on the peripheral main surface M1, with the band g1 being inner to the band g2, and the band g2 being inner to the band g3. Thus, each of the bands g1, g2, g3 concentrically surrounds the recess 111. The thickness of each band g1, g2, g3 is about 0.3 μm to 0.2 μm.

The bands g1, g2, g3 of sealing glass desirably are of formed of lead-free, vanadium-based glass that melts at 350° C. to 400° C. for use as a bonding material. The melting point of the sealing glass is lower than the melting point of the package lid 11A (made of a piezoelectric material or higher-mp glass). This allows the sealing glass to form rugged hermetical seals that resist incursion of water and humidity. (The lead-free, vanadium-based glass is referred to herein as "low-melting-point glass" or "low-mp glass.") Since the coefficient of thermal expansion of low-mp glass can be controlled effectively by controlling its glass structure, low-mp glass can be bonded to various materials having different respective coefficients of thermal expansion, such as ceramics, glass, semiconductor material, and metal.

The package base 12A is fabricated from a base 120A formed of a piezoelectric material such as quartz crystal or glass. The inner main surface of the package base 12A defines a recess 121 and peripheral main surface M2 surrounding the recess 121. The peripheral main surface M2 is situated atop a protruding portion 122. The protruding portion 122 surrounds the recess, and the peripheral main surface M2 has a width WI. Respective bands p1, p2 of polyimide-resin adhesive (hereinafter generally referred to as the "adhesive"), each having a width of W/5, are formed on the peripheral main surface M2, with the band p1 being inner to the band p2. The adhesive bands p1, p2 are situated on the peripheral main surface M2 so as to be disposed between respective flanking bands g3, g2 and g2, g1 of low-mp sealing glass (FIG. 2B). The adhesive of the bands p1, p2 forms a bond when heated to 250° C. or higher to drive off solvent in the adhesive. The thickness of each band p1, p2 is about 0.3 μm to 2 μm.

Bonding the package lid 11A and package base 12A together is achieved by heating the structure shown in FIG. 2B at 350° C. to 400° C. in nitrogen gas or a vacuum environment while compressing the package lid 11A and the package base 12A together. The bonds are formed by the low-mp glass bands g1, g2, g3 and the adhesive bands p1, p2 (see FIG. 2B). I.e., the low-mp glass bands g1, g2, g3 formed on the peripheral main surface M1 of the package lid 11A are bonded to the peripheral main surface M2 of the package base 12A, and the adhesive bands p1, p2 formed on the peripheral main surface M2 of the package base 12A are bonded to the peripheral main surface M1 of the package lid 11A. The low-mp glass bands g1, g2, g3 and adhesive bands p1, p2 collectively form a sealing material SL that completely seals together the peripheral main surfaces M1, M2. As a result of this bonding together of the package lid and package base, the respective recesses 111, 121 collectively form a package cavity CT that accommodates the quartz-crystal vibrating piece 10. The cavity CT can be filled with nitrogen or other inert gas or evacuated to a desired vacuum level, and can maintain these environments in a hermetically sealed manner.

The adhesive bands p1, p2 prevent the fragile, low-mp sealing glass from being damaged by physical impacts, while the bands of low-mp sealing glass prevent moisture (normally present in air) from penetrating through the sealing material SL to the cavity CT, which would degrade or destroy the established vacuum or inert-gas environment in the cavity CT. Even if moisture penetrates through an interface between a band g3 of sealing glass and the peripheral main surface M1 or through an interface between the band g3 of sealing glass and the peripheral main surface M2, the adhesive bands p1, p2 absorb this moisture. Thus, incursion of moisture into the package is prevented. The sealing-glass band g1, situated nearest the cavity CT in the sealing material SL, can also prevent gas (generated when the adhesive bands p1, p2 are thermally cured) from entering the cavity CT.

In this embodiment, although the sealing-glass bands are formed on the peripheral main surface M1 of the package lid 11A and the adhesive bands are formed on the peripheral main surface M2 of the package base 12A, the adhesive bands alternatively may be formed on the peripheral main surface M1 of the package lid 11A while the sealing-glass bands are formed on the peripheral main surface M2 of the package base 12A. Furthermore, although the sealing material SL of this embodiment comprises three bands of sealing glass and two bands of adhesive, the sealing material SL alternatively may be formed of any number of bands, so long as at least two bands of each material are used. In addition, each band may have the same or a different width than another band. It is desirable that the band nearest the cavity CT be a band of sealing glass.

Method for Manufacturing First Embodiment of Quartz-Crystal Vibrating Device

Figure 3:
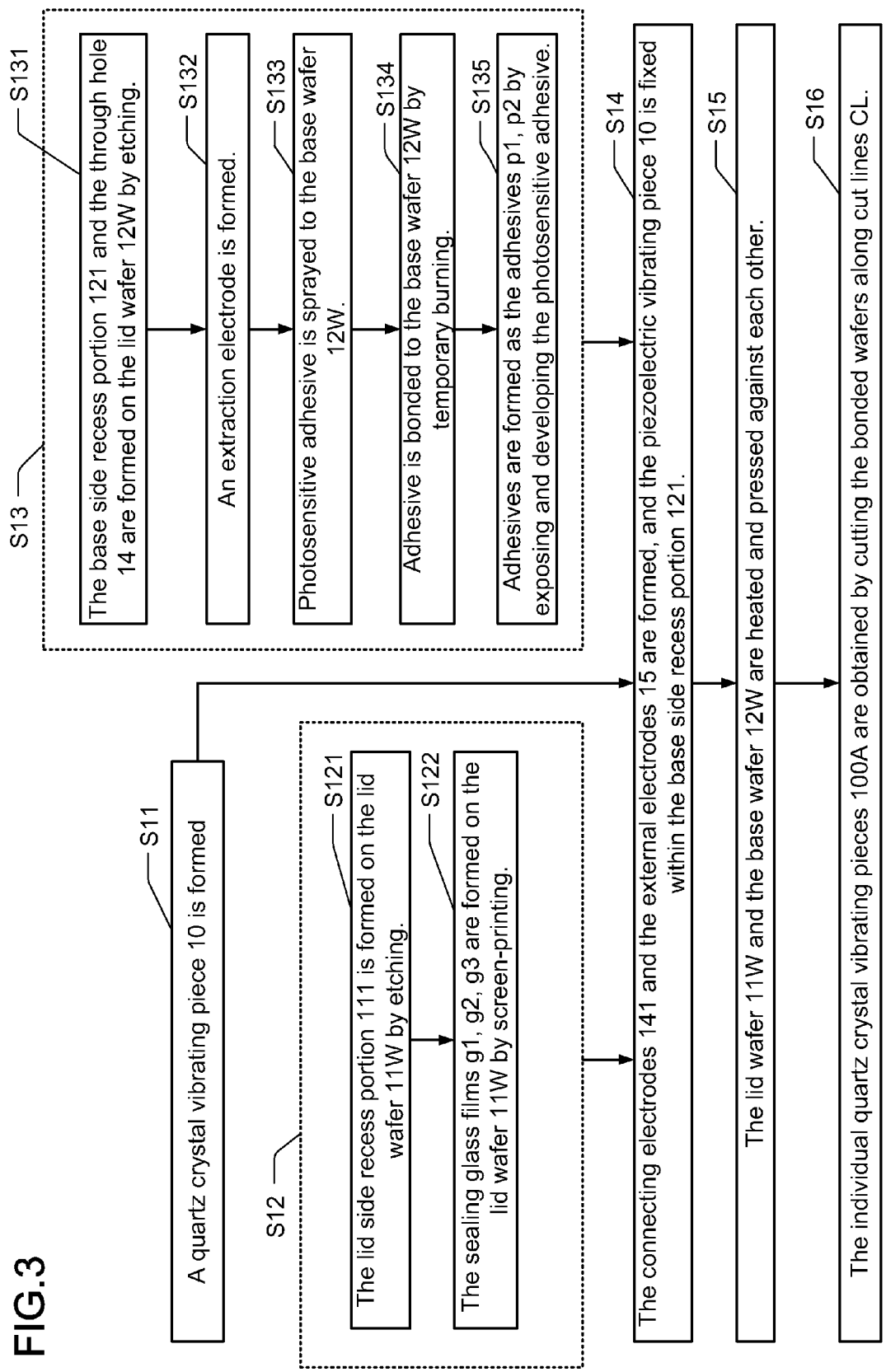
FIG. 3 is a flow-chart of steps in an embodiment of a method for manufacturing the first embodiment of a quartz-crystal vibrating device.
Figure 4:
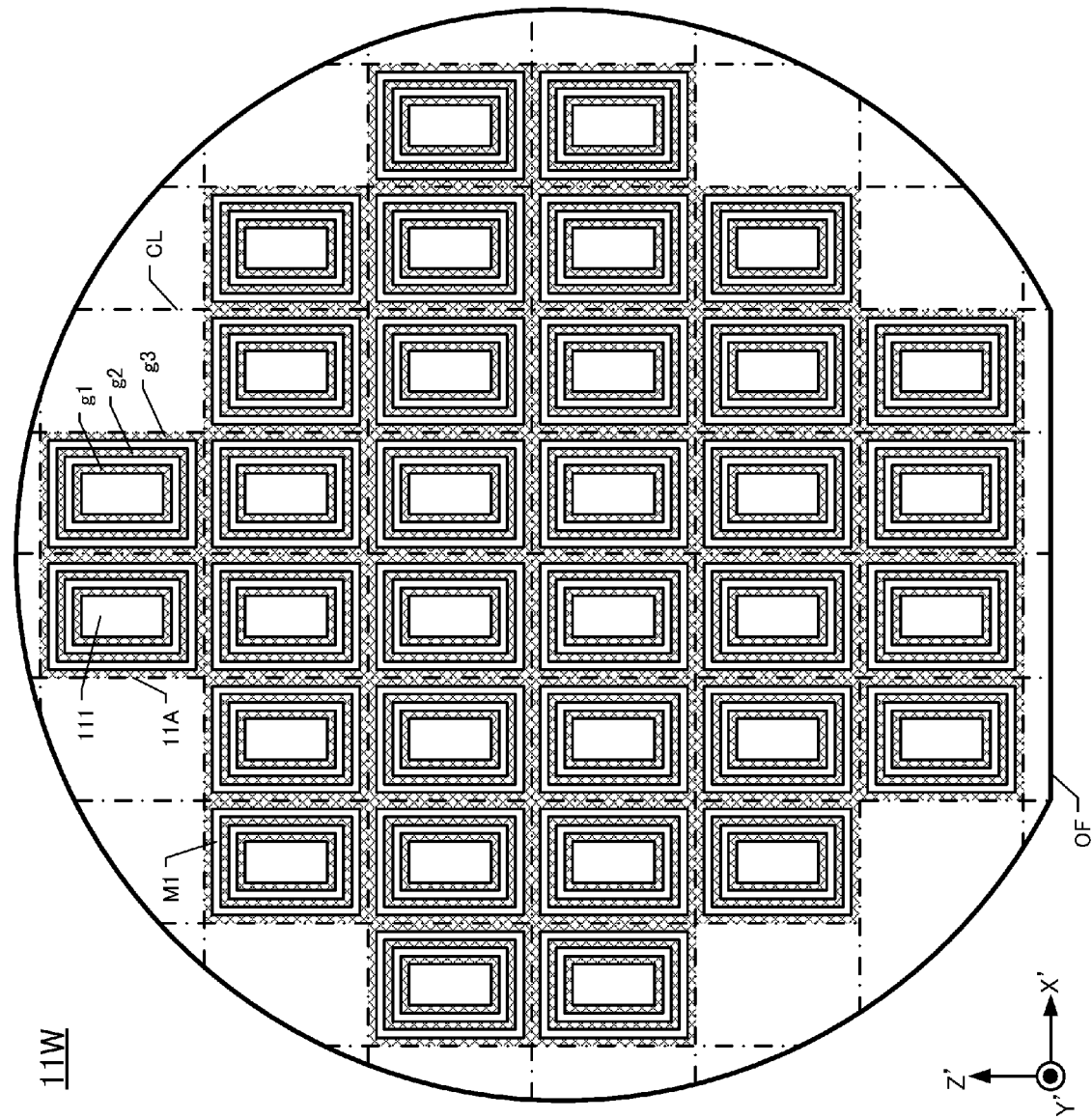
FIG. 4 is a plan view of a lid wafer used for simultaneously fabricating multiple package lids of the first embodiment.
Figure 5:
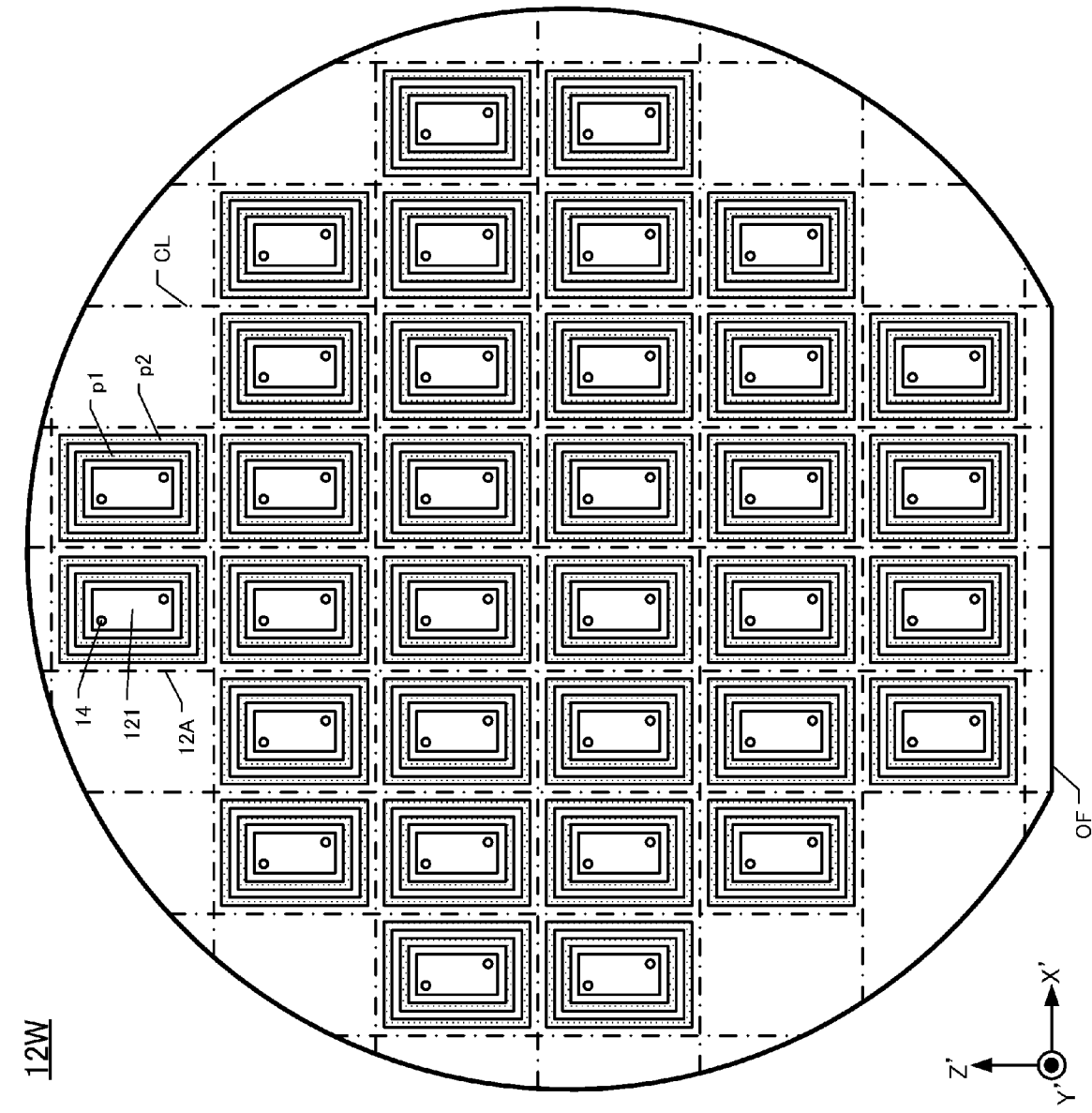
FIG. 5 is a plan view of a base wafer used for simultaneously fabricating multiple package bases of the first embodiment.

A flow-chart of this method for manufacturing a quartz-crystal vibrating device 100A is shown in FIG. 3. The method includes a protocol for manufacturing the quartz-crystal vibrating piece (step S11), a protocol for manufacturing the package lid 11A (step S12), and a protocol for manufacturing the package base 12A (step S13). These protocols can be carried out separately or in parallel. FIG. 4 is a plan view of a lid wafer 11W, and FIG. 5 is a plan view of a base wafer 12W, both used for simultaneously manufacturing multiple quartz-crystal vibrating devices 100A.

In protocol S11, the quartz-crystal vibrating piece 10 (see FIG. 1) is fabricated as follows: First, a respective metallic layer is formed on each main surface of a quartz-crystal wafer (not shown) by sputtering or vacuum-deposition. Then, a respective layer of photoresist is applied uniformly to the metallic layer on each main surface of the quartz-crystal wafer. Using an exposure tool (not shown), a pattern defining multiple quartz-crystal vibrating pieces 10 is transferred by exposure from a photomask defining the pattern to both photoresist-covered main surfaces of the quartz-crystal wafer. Next, portions of the metallic layers left denuded by removed photoresist are etched. Then, respective excitation electrodes 102 are formed on both main surfaces of the quartz-crystal wafer. The resulting completed quartz-crystal vibrating pieces 10 can be cut individually from the wafer and finished.

In protocol S12 the package lids 11A are fabricated. The protocol S12 includes steps S121 and S122. As shown in FIG. 4, several hundreds to several thousands of package lids 110A are typically formed simultaneously on a single lid wafer 11W. The lid wafer 11W is a circular, uniformly planar plate of quartz crystal. An alternative lid-wafer material is glass. In either event, the recesses 111 on the inner main surfaces are formed by etching or micro-machining in the vicinity of the center of each lid 110. Forming the recesses 111 leaves respective peripheral main surfaces M1 that surround the respective recesses.

In step S122, the bands g1, g2, g3 of sealing glass are formed on the peripheral main surfaces M1 of the package lids 11A by screen-printing from a stencil. The screen is, for example, a fabric made of nylon, Teflon™, or stainless steel. More specifically, the pattern defining the sealing-glass bands g1, g2, g3 are formed on the surface of the screen with resist; a print is made from the screen by urging ink to flow through respective permeable portions of the screen.

In protocol S13, package bases 12A are produced. Protocol S13 includes steps S131-S135. In step S131, several hundreds to several thousands of package bases 120A are formed simultaneously on a base wafer 12W made of a circular, planar plate of quartz-crystal, as shown in FIG. 5. The base recesses 121 are formed by etching or micromachining, simultaneously with formation of through-holes 14. Each base recess 121 is peripherally surrounded by a respective peripheral main surface M2.

In step S132, a foundation layer of chromium (Cr) is formed, followed by formation of an overlying layer of gold (Au), on the entire surface of the base wafer 12W. These layers are formed by sputtering or vacuum-deposition. By photolithographic exposure and etching, extraction electrodes (not shown) are formed on the package bases for connecting the excitation electrodes 102 of the piezoelectric vibrating pieces 10 via respective through-holes 14 formed on the peripheral main surface M2.

In step S133 photosensitive adhesive is applied (e.g., by spraying) to the base wafer 12W. The entire surface of the base wafer 12W is coated uniformly with the adhesive.

In step S134 the adhesive is bonded to the base wafer 12W by a preliminary curing step. This step is conducted at a temperature of about 250° C., which is sufficient to produce an approximately 75% cure of the adhesive.

Turning to FIG. 5, in step S135 the adhesive bands p1, p2 are formed on the peripheral main surface M2 of the package base 12A by appropriately exposing the photosensitive adhesive.

In step S14 the connection electrodes 141 and external electrodes 15 (see FIG. 2) are formed. A respective connection electrode 141 is formed in each through-hole 14, followed by formation of the respective external electrodes 15 (to be connected to respective connection electrodes 141) on the lower main surface of the package base 11A. Afterward, a respective piezoelectric vibrating piece 10 produced in step S11 is mounted within each recess 121 of the respective package base, using an electrically conductive adhesive 13. The piezoelectric vibrating piece 10 is mounted within the recess 111 such that the excitation electrodes 102 on the piezoelectric vibrating piece 10 are aligned with the respective connecting electrodes 141.

In step S15 bands g1, g2, g3 of sealing glass and bands p1, p2 of adhesive are heated at 350° C. to 400° C., accompanied by compression of the lid wafer 11W and the base wafer 12W together to bond the lid wafer 11W to the base wafer 12W. To facilitate alignment of the wafers with each other, before compression each wafer 11W, 12W includes an orientation flat OF. I.e., using the orientation flats OF as alignment references, the lid wafer 11W formed in step S12 and the base wafer 12W formed in step S13 are stacked precisely and bonded with each other during this compression step.

The bands g1, g2, g3 of sealing glass are useful for, inter alia, preventing gas (generated when the adhesive bands p1, p2 are heated to 350° C. to 400° C.) from entering the cavity CT. As a result, the piezoelectric vibrating piece 10 in the cavity CT can vibrate over a longer lifetime at a more accurate frequency.

In step S16, the sandwich consisting of the lid wafer 11W and base wafer 12W bonded together is cut to separate individual quartz-crystal vibrating devices 100A from each other. During cutting, individual quartz-crystal vibrating devices 100A are produced by cutting the wafer sandwich along cut lines CL (denoted by dot-dash lines in FIGS. 4 and 5) using a dicing unit such as a laser beam or a dicing saw. Thus, several hundreds to several thousands of quartz-crystal vibrating devices 100A are produced, each producing an accurate vibration frequency.

Second Representative Embodiment

Figure 6:
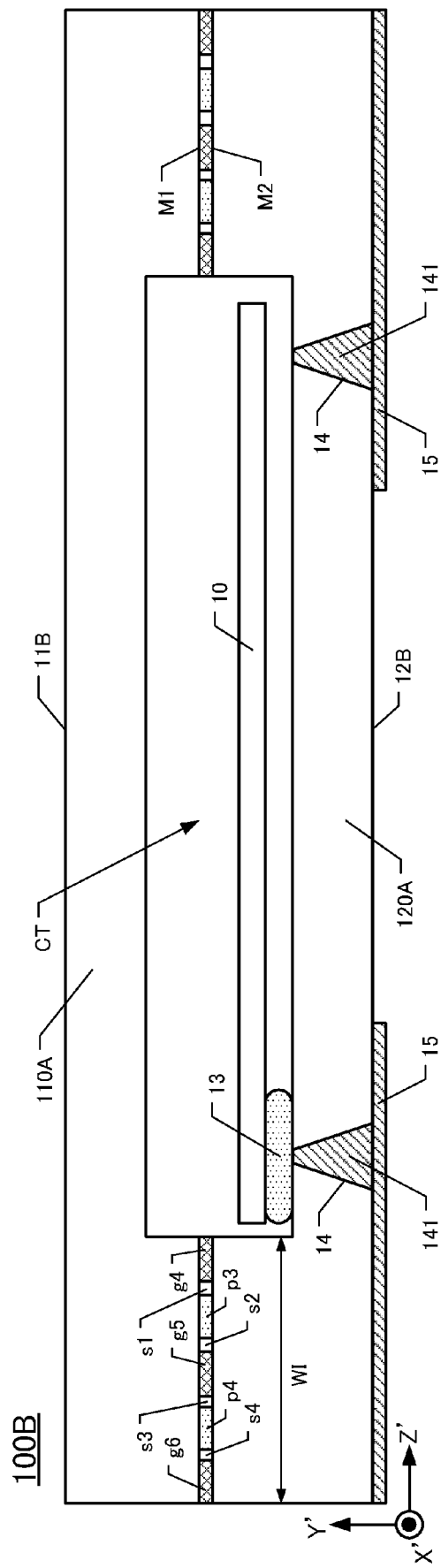
FIG. 6 is an elevational section of a second embodiment of a quartz-crystal vibrating device after bonding together a package lid and a package base to enclose a quartz-crystal vibrating piece.

This embodiment of a quartz-crystal vibrating device 100B is depicted in FIG. 6, which is an elevational section of the device as it exists after the wafers 11B and 12B have been bonded together. In FIG. 6, components that are similar to corresponding components in the first representative embodiment have the same respective reference numerals.

The quartz-crystal vibrating device 100B includes a piezoelectric vibrating piece 10, a package base 12B on which a piezoelectric vibrating piece 10 is mounted, and a package lid 11B that is bonded to the package base 12B.

In this embodiment, bands g4, g5, g6 of sealing glass are formed on the peripheral main surface M1 of the package lid 11B so as to circumscribe the recess in the package lid, as in the first representative embodiment. Similarly, bands p3, p4 of adhesive are formed on the peripheral main surface M2 of the package base 12B so as to circumscribe the recess in the package base. In this embodiment each band g4, g5, g6 of sealing glass has a respective width <WI/5. Also, each band p3, p4 of adhesive has a respective width <WI/5. The sealing-glass band g4 has a width that extends up to the inside edge of the peripheral main surface M1 of the package lid 11B. Simultaneously, the sealing-glass band g6 has a width that extends up to the outside edge of the peripheral main surface M1.

Whenever the package lid 11B and the package base 12B are bonded together by the bands g4, g5, g6 of sealing glass and bands p3, p4 of adhesive, as shown in FIG. 6, gaps s1-s4 are formed between each respective pair of bands. These gaps serve important functions. For example, whenever they are absorbing moisture from outside, the bands p3, p4 of adhesive expand. By providing the gaps s1-s4 between respective pairs of bands, the bands g4, g5, g6 of sealing glass experience no forces generated in the lateral direction (Z'-axis direction) by expansion of the adhesive bands p3, p4. Thus, the package lid 11B and package base 12B are bonded to each other more stably.

A description of a method for manufacturing the second embodiment of a quartz-crystal vibrating device 100B is omitted because its flow-chart is the same as the flow-chart of the method for manufacturing the first embodiment.

Third Representative Embodiment

Figure 7:
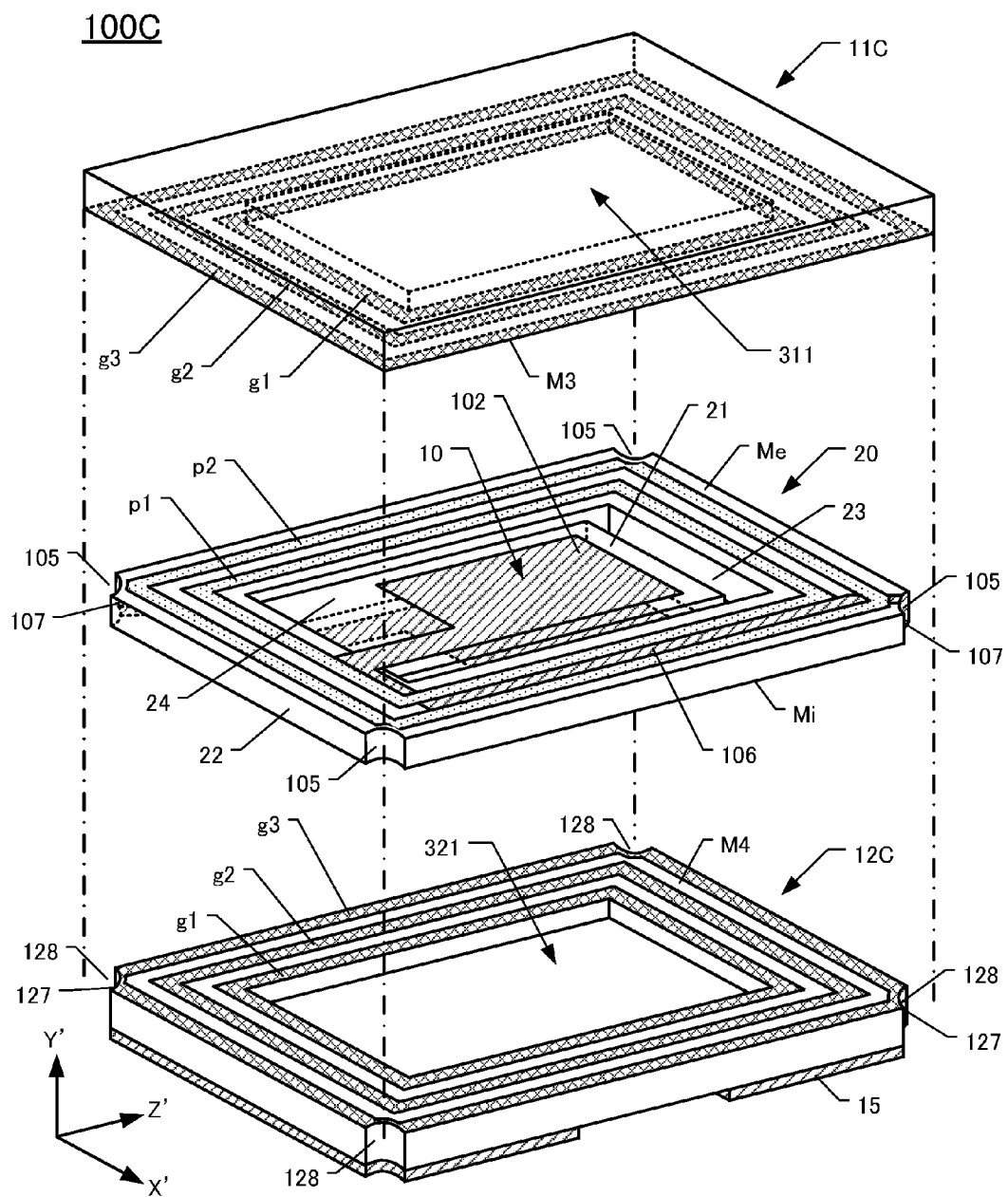
FIG. 7 is an exploded perspective view of a third embodiment of a quartz-crystal vibrating device.

FIG. 7 is an exploded perspective view of the third embodiment of a quartz-crystal vibrating piece 100C of this embodiment. FIGS. 8A and 8B are respective elevational sections of the quartz-crystal vibrating device 100C, wherein FIG. 8A shows a condition before the package lid 11C, quartz-crystal frame 20, and package base 12C have been bonded together. FIG. 8B is an elevational section showing a condition after the package lid 11C, quartz-crystal frame 20, and package base 12C have been bonded together.

As shown in FIGS. 7 and 8A-8B, in this embodiment of a quartz-crystal vibrating device 100C the package lid 11C is uppermost, the package base 12C is lowermost, and the quartz-crystal frame 20 is sandwiched between the package lid and package base. The package lid 11C defines a recess 311 foamed by, e.g., wet-etching. The recess 311 faces the quartz-crystal frame 20. The package base 12C also defines a recess 321 formed by, e.g., wet-etching. The recess 321 faces the quartz-crystal frame 20. The recesses 311, 321, in cooperation with the quartz-crystal frame 20, define a cavity CT formed by bonding the package lid 11C and package base 12C to respective main surfaces of the quartz-crystal frame 20. This bonding can be performed in a nitrogen-gas or vacuum condition, as shown in FIG. 8B, so that the cavity CT filled with nitrogen gas or evacuated.

The package lid 11C includes a body 110C fabricated of a piezoelectric material (e.g., quartz crystal) or glass. As a result of the recess 311, the lid body 110C includes a protruding portion 312 that defines a peripheral main surface M3. The peripheral main surface M3 has a width WI and extends around the periphery of the recess 311. Formed on the peripheral main surface M3 are bands g1, g2, g3 of sealing glass. The bands g1, g2, g3 circumscribe the recess 311. Each band g1, g2, g3 has a respective width=WI/5. The glass band g1 is closest to the inner edge of the peripheral main surface M3 and thus closest to the edge of the recess 311. The glass band g3 is closest to the outer edge of the peripheral main surface M3. The middle glass band g2 is situated between and spaced from the bands g1 and g3. The thickness of each band g1, g2, g3 of sealing glass is in the range of about 0.3 μm to 2 μm.

The package base 12C includes a body 120C fabricated of a piezoelectric material (e.g., quartz crystal) or glass. As a result of the recess 321, the base body 120C includes a protruding portion 322 that defines a peripheral main surface M4. The peripheral main surface M4 has a width WI equal to the width WI of the peripheral main surface M3. Formed on the peripheral main surface M4 are bands g1, g2, g3 of sealing glass. The bands g1, g2, g3 circumscribe the recess 321. Each band g1, g2, g3 has a respective width=WI/5. The glass band g1 is closest to the inner edge of the peripheral main surface M4 and thus is closest to the edge of the recess 321. The glass band g3 is closest to the outer edge of the peripheral main surface M4. The middle glass band g2 is situated between and spaced from the bands g1 and g3. The thickness of each band g1, g2, g3 of sealing glass is in the range of about 0.3 μm to 2 μm.

Respective external electrodes 15 are located on the lower main surface 12C of the package base 12C. A castellation 128 is situated at each corner of the package base 12C. The castellation 128 is formed at the wafer stage in which a respective through-hole BH (see FIG. 11) is provided at each corner of the package base 120C. On the respective surface of each of two castellations 128 situated diagonally with respect to each other is a respective connection electrode 127. The connection electrodes 127 electrically connect respective external electrodes 15 with respective excitation electrodes 102 on the quartz-crystal frame 20.

The quartz-crystal frame 20 is fabricated of AT-cut quartz-crystal material. The quartz-crystal frame 20 has an upper main surface Me facing the package lid 11C side and a lower main surface Mi facing the package base 12C. The quartz-crystal frame 20 comprises a vibrating portion 21 and a frame portion 22, wherein the frame portion surrounds the vibrating portion 21. On the upper main surface Me and the lower main surface Mi of the frame portion 22 are adhesive bands p1, p2, each having a width=WI/5. The adhesive bands p1, p2 extend around the frame portion 22 in respective positions corresponding to the respective spaces between the bands g1, g2, g3 of sealing glass. The thickness of each adhesive band p1, p2 is in the range of about 0.3 μm to 2 μm.

Defined in the quartz-crystal frame 20 is a U-shaped void 23 located between the vibrating portion 21 and the frame portion 22 so as to separate the vibrating portion 21 as much as possible from the frame portion 22. Between the ends of the "U" is a connecting portion 24 by which the vibration portion 21 remains connected to the frame portion 22. The vibrating portion 21 has an upper main surface Me and a lower main surface Mi. On each main surface Me, Mi is a respective excitation electrode 102 and a respective extraction electrode 106. These electrodes are electrically conductive. At each corner of the quartz-crystal frame is a respective castellation 105. The castellations 105 are formed at the wafer stage in which a respective through-hole CH (see FIG. 10) is provided at each corner of the crystal frame 10. On the respective surface of each of two castellations 105 situated diagonally with respect to each other is a respective connection electrode 107. The connection electrodes 107 electrically connect the respective castellation 128 on the package base 12C with a respective extraction electrode 106 on the quartz-crystal frame 20.

Whenever an alternating voltage (i.e., a potential that alternates between positive and negative) is applied to the external electrodes 15, the alternating voltage is applied to the excitation electrodes 102 to incite the quartz-crystal frame 20 to exhibit thickness-shear vibration. Although, in this embodiment, the quartz-crystal frame is constructed so that the void 23 extends around three sides of the vibrating portion 21, the void 23 may be omitted. Further alternatively, the vibrating portion 21 may have a "mesa" configuration or an "inverse-mesa" configuration.

Whenever the sealing-glass bands g1, g2, g3 and the adhesive bands p1, p2 are heated at 350° C. to 400° C. while compressing the package lid 11C and the package base 12C together against the quartz-crystal frame 20 sandwiched therebetween, the package lid 11C, the quartz-crystal frame 20, and the package base 12C become bonded together (see FIG. 8B). I.e., the bands g1, g2, g3 of sealing glass formed on the peripheral main surface M3 of the package lid 11C are bonded to the upper main surface Me of the quartz-crystal frame 20, and the bands p1, p2 of adhesive formed on the quartz-crystal frame 20 are bonded to the peripheral main surface M3 of the package lid 11C. Meanwhile, the bands g1, g2, g3 of sealing glass formed on the peripheral main surface M4 of the package base 12C become bonded to the lower main surface Mi of the quartz-crystal frame 20, and the bands p1, p2 of adhesive formed on the quartz crystal frame 20 are bonded to the peripheral main surface M4 of the package base 12C. The adhesive bands p1, p2 and sealing-glass bands g1, g2, g3 collectively form the sealing material SL. In the resulting package, the lid recess 111, frame portion 22, and base recess 121 form the cavity CT in which the quartz-crystal vibrating piece 10 is accommodated. The cavity is hermetically sealed by the sealing material SL.

As in the first and second representative embodiments, the sealing material SL prevents the sealing glass (which is fragile) from being damaged by physical shocks. The sealing material SL also prevents atmospheric moisture from penetrating the adhesive into the package, thereby preventing deterioration of the vacuum condition inside the package.

In this embodiment, although the bands of sealing glass are formed on respective peripheral main surfaces of the package lid 11C and package base 12C while the bands of adhesive are formed on respective main surfaces of the quartz-crystal frame, in an alternative scheme the adhesive bands may be formed on respective peripheral main surfaces of the package lid 11C and package base 12C while the sealing-glass bands are formed on respective main surfaces of the quartz-crystal frame. Furthermore, although the sealing material SL comprises five bands (including the sealing-glass bands and the adhesive bands), the sealing material alternatively may be formed of any number of bands so long as two or more bands of each material (glass and adhesive) are provided. The bands need not have identical widths; for example, each band may have a different width. It is desirable that the band located nearest the cavity CT be a band of sealing glass.

In this embodiment, although the package lid 11C, quartz-crystal frame 20, and package base 12C are bonded together with sealing glass and adhesive, in an alternative scheme the package lid 11C and quartz-crystal frame 20 may be bonded together by siloxane bonding (Si—O—Si) while the quartz-crystal frame 20 and package base 12C are bonded together with sealing glass and adhesive. Similarly, and in a further alternative scheme, the package lid 11C and quartz-crystal frame 20 may be bonded together with sealing glass and adhesive, while the quartz-crystal frame 20 and package base 12C are bonded together by siloxane bonding.

Method for Manufacturing Third Embodiment of Quartz-Crystal Vibrating Piece

Figure 9:
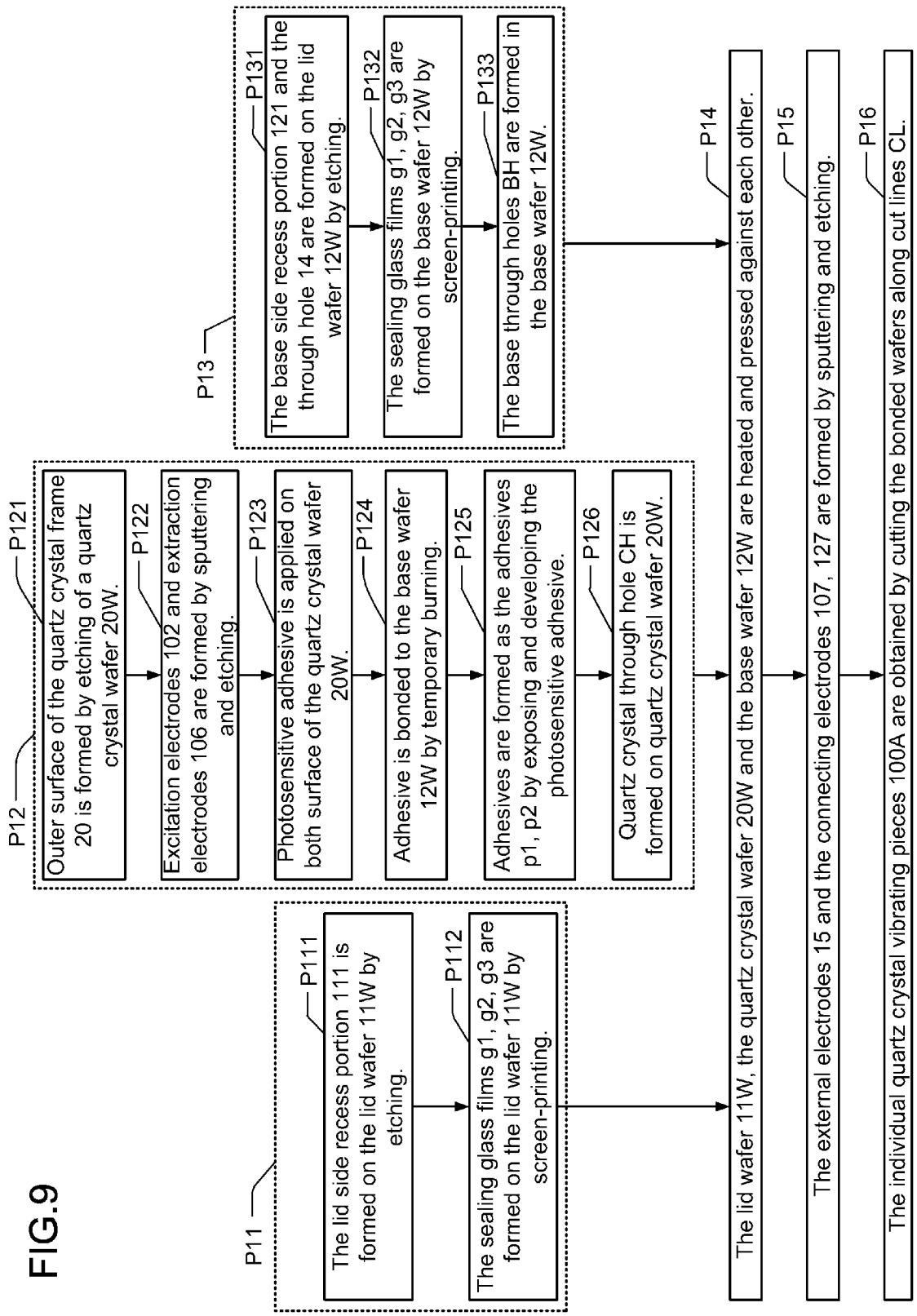
FIG. 9 is a flow-chart of an embodiment of a method for manufacturing the third embodiment of a quartz-crystal vibrating device.
Figure 10:
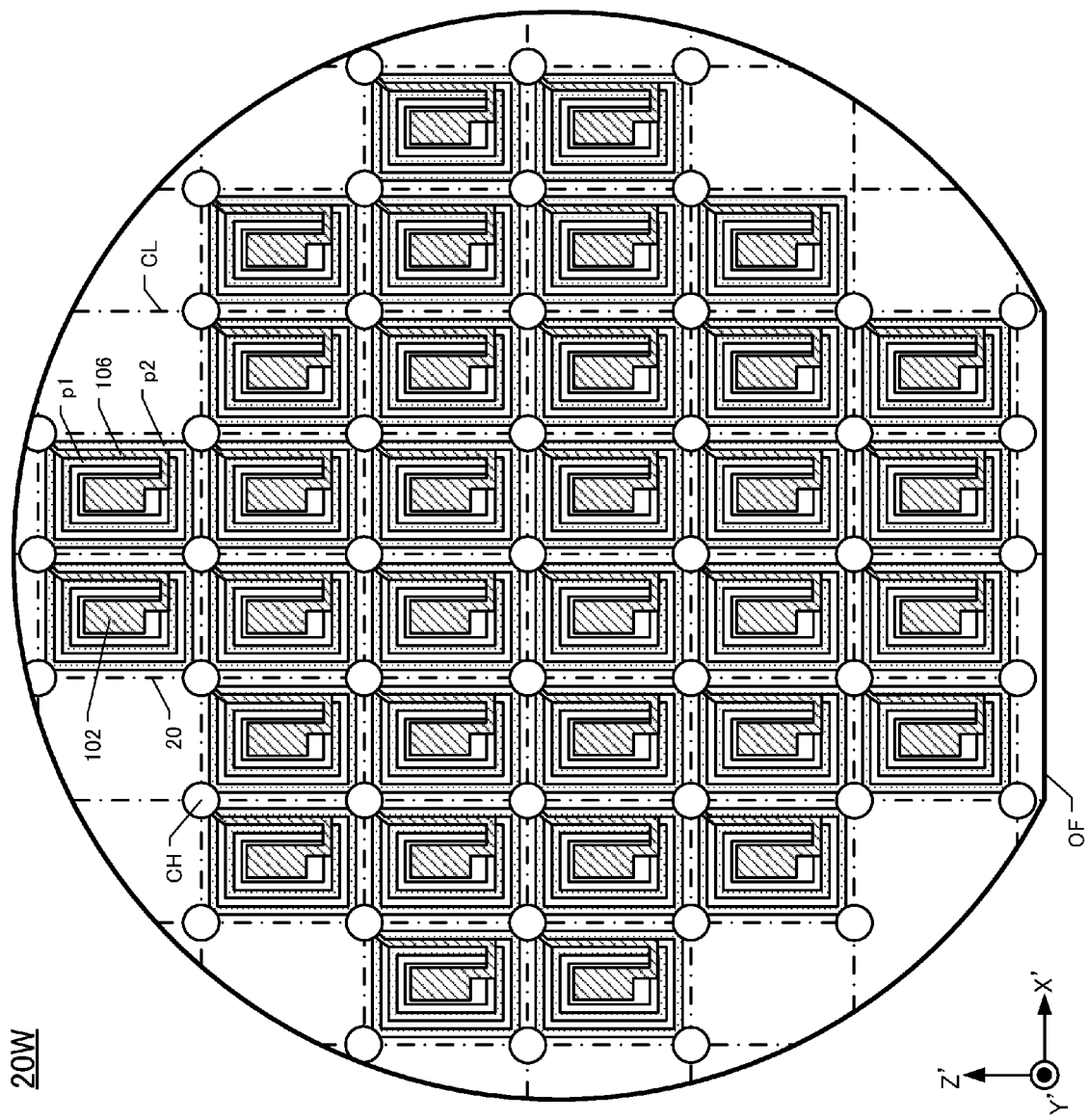
FIG. 10 is a plan view of a quartz-crystal wafer as used for simultaneously fabricating multiple piezoelectric vibrating pieces.
Figure 11:
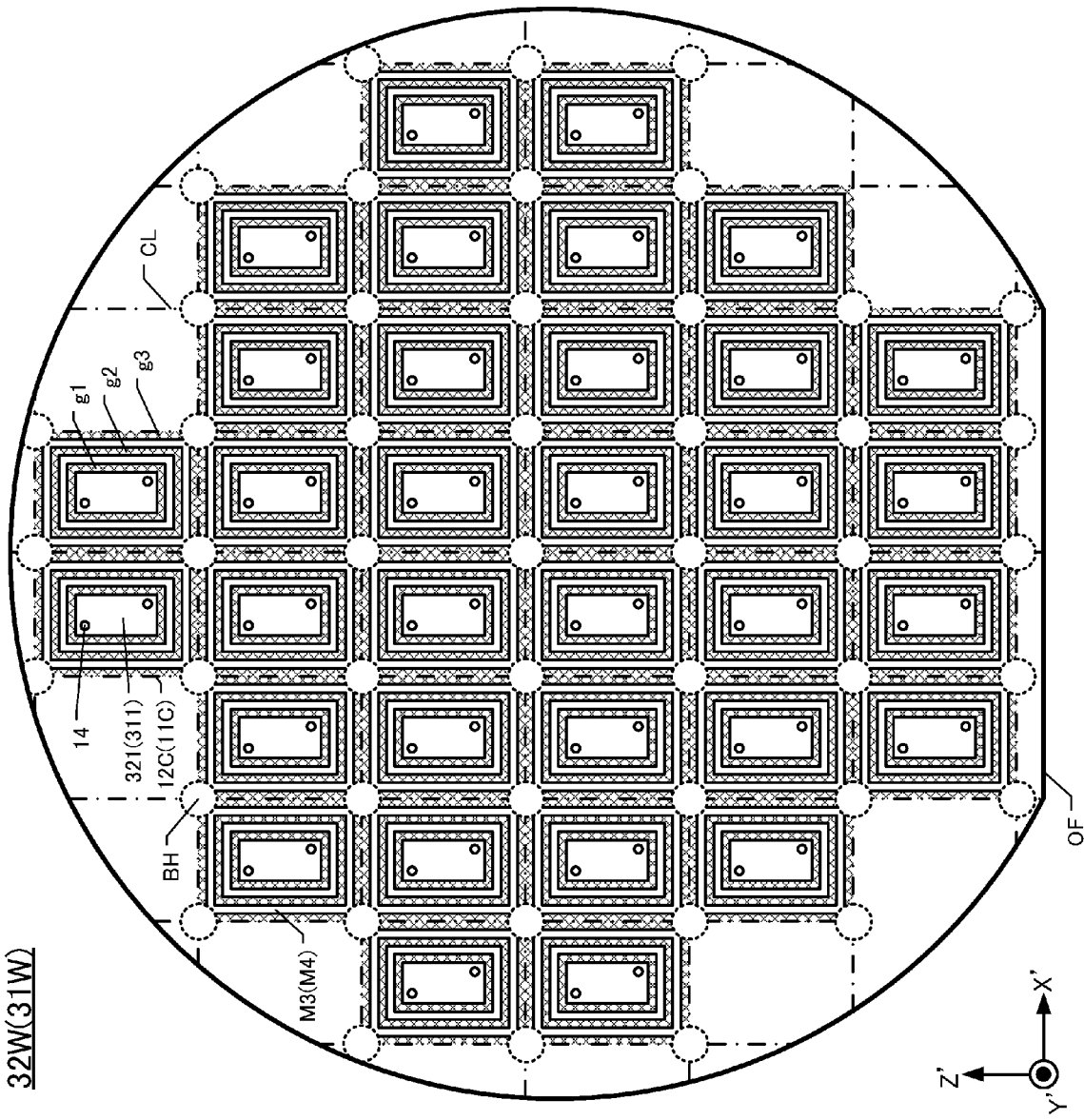
FIG. 11 is a plan view of a lid wafer or a base wafer used for fabricating multiple package lids and/or multiple package bases, respectively.

FIG. 9 is a flow-chart of an exemplary method for manufacturing the third representative embodiment of a quartz-crystal vibrating device 100C. In FIG. 9, the manufacturing protocol P11 for fabricating the quartz-crystal frame 20, the manufacturing protocol P12 for fabricating the package lid 11C, and the manufacturing protocol P13 for fabricating the package base 12C may be carried out separately, in parallel with each other. FIG. 10 is a plan view of a quartz-crystal wafer 20W used for fabricating multiple quartz crystal frames 20 according to the third representative embodiment. FIG. 11 is a plan view of a base wafer 32W used for fabricating multiple package bases 12C according to the third representative embodiment. A plan view of a lid wafer 31W is similar to FIG. 11, except that the lid wafer 31W has no base through-holes BH, as indicated by dotted-line circles in FIG. 11.

Manufacturing protocol P11 includes steps P111-P116 for manufacturing quartz-crystal frames 20. In step P111 the quartz-crystal vibrating portions 21 and the through-holes CH are formed on a quartz-crystal wafer 20W configured as a uniformly planar, circular plate of quartz crystal, as shown in FIG. 10. In step P112 a gold (Au) layer is formed over the entire upper main surface Me and lower main surface Mi of the quartz-crystal wafer 20W by sputtering or vacuum-deposition. The gold layer is formed over a layer of chromium (Cr) that serves as a foundation layer. Afterward, as in step S11 of the method embodiment shown in FIG. 3, the surfaces of the wafer are etched according to a photoresist pattern. Thus, as shown in FIG. 10, the excitation electrodes 102 and extraction electrodes 106 are formed on the upper and lower main surfaces Me and Mi, respectively.

The following steps are not shown in FIG. 9: P113, P114, P115, and P116. In step P113 a photosensitive adhesive is sprayed uniformly onto the entire upper main surface Me and entire lower main surface Mi. In step P114, the adhesive is bonded to the upper and lower main surfaces Me, Mi by partial curing. In step P115 the photosensitive adhesive is exposed to form the adhesive bands p1, p2 on the upper main surface Me and lower main surface Mi of the quartz-crystal wafer 20W (see FIG. 10). In step P116 through-holes CH are formed by etching at each of the four corners of each quartz-crystal frame 20 on the quartz-crystal wafer 20W, as shown in FIG. 10.

Manufacturing protocol P12 of FIG. 9 includes steps P121 and P122, in which package lids 11C are fabricated. In step P121, multiple recesses 311 are formed in the lid-wafer 31W, each surrounded by a respective peripheral main surface M3. The lid-wafer 31W comprises a uniformly-planar, circular quartz crystal as shown in FIG. 11. The wafer can be fabricated by etching or machining. In step P122 bands g1, g2, g3 of sealing glass are formed on the peripheral main surfaces M3 of the package lids 11C by screen-printing using a stencil, for example.

Manufacturing protocol P13 includes steps P131-P133 for manufacturing the package bases 12C. In step P131 multiple recesses 321 are formed in the base wafer 32W, each surrounded by a respective peripheral main surface M4. The base wafer 32W comprises a uniformly planar, circular quartz-crystal wafer as shown in FIG. 11. The wafer can be fabricated by etching or micromachining. The through-holes 14 are simultaneously formed at respective locations shown in FIG. 11. In step P132 bands g1, g2, g3 of sealing glass are formed on the peripheral main surfaces M4 of the package bases 12C by screen-printing using a stencil, for example.

In step P133, as shown in FIG. 11, the base through-holes BH are formed on each of the four corners of each package base 12C in the base wafer 32W by etching.

In manufacturing protocol P14, the bands g1, g2, g3 of sealing glass and the bands p1, p2 of adhesive are heated as the lid wafer 31W, quartz-crystal wafer 20W, and base wafer 32W are compressed against each other to bond the lid wafer 31W, quartz-crystal wafer 20W, and base wafer 32W together. The heating temperature is in the range of 350° C. to 400° C.

In step P15, external electrodes 15 are formed on the lower main surface (mounting surface) of the base wafer 32W in the same manner as described in step P112. Thus, connection electrodes 107, 127 are formed in the through-holes CH and BH.

In step P16, the bonded-together lid wafer 31W, quartz-crystal wafer 20W, and base wafer 32W are cut into individual quartz-crystal vibrating devices 100C. Wafer cutting is normally performed along the cut lines CL denoted by dotted lines in each of FIGS. 10 and 11. By cutting across the through-holes CH and the base through-holes BH, castellations 128 are formed. Normally, several hundred to several thousand quartz-crystal vibrating devices 100C are produced in this manner, each producing the desired vibration accurately at a designated frequency.

INDUSTRIAL APPLICABILITY

Representative embodiments have been described in detail above. As evident to those skilled in the art, the present invention may be changed or modified in various ways within the technical scope of the invention. For example, alternatively to piezoelectric vibrating devices, the present invention may be directed to manufacture of piezoelectric oscillators in which an IC accommodating an oscillating circuit is mounted inside the package on the package base.

In this specification, although the various embodiments have been described as producing vibrations from AT-cut piezoelectric vibrating devices, the invention can be applied with equal facility to tuning-fork type piezoelectric vibrating pieces and devices comprising a pair of vibrating arms.

What is claimed is:

1. A piezoelectric vibrating device, comprising:
    a piezoelectric vibrating piece that vibrates when electrically energized;
    a first package plate having an inner main surface defining a recess, the recess having volume and dimensions sufficient to contain at least a portion of the piezoelectric vibrating piece, the inner main surface including a peripheral main surface that peripherally extends around the recess; and
    a second package plate having inner and outer main surfaces, the inner main surface being bonded to the peripheral main surface of the first package plate using a sealing material that thus seals the piezoelectric vibrating piece inside a package formed of the first and second package plates, the sealing material including multiple concentric bands of sealing glass and multiple concentric bands of adhesive, the sealing-glass bands and the adhesive bands circumscribing the recess.

2. The device of claim 1, wherein the bands of sealing glass and the bands of adhesive are arranged alternatingly with respect to distance outward from the recess.

3. The device of claim 2, wherein the band located nearest the recess is a band of sealing glass.

4. The device of claim 1, wherein the band located nearest the recess is a band of sealing glass.

5. The device of claim 1, wherein:
    the adhesive is a polyimide resin; and
    the polyimide resin has a curing temperature in a temperature range similar to a range of melting temperature of the sealing glass.

6. The device of claim 1, wherein each sealing-glass band comprises a low-melting-point glass having a melting point lower than a melting point of the first plate or of the second plate.

7. The device of claim 1, wherein:
    each sealing material includes at least one gap, situated between a respective sealing-glass band and a respective adhesive band;
    in the gap substantially no sealing glass or adhesive is present.

8. The device of claim 1, wherein each band of sealing glass is formed by mask-printing and each band of adhesive is formed by photolithography.

9. A piezoelectric vibrating device, comprising:
- a piezoelectric plate comprising a piezoelectric vibrating piece that vibrates when electrically energized and further comprising a frame body foamed integrally with the piezoelectric vibrating piece so as to surround the piezoelectric vibrating piece while providing first and second main surfaces;
- a first plate bonded to the first main surface of the frame body using a first sealing material; and
- a second plate bonded to the second main surface of the frame body using a second sealing material, thereby sandwiching the frame body between the first and second plates and sealingly enclosing the piezoelectric vibrating piece within a package comprising the frame body and first and second plates, wherein
  - the first sealing material comprises multiple bands of sealing glass and multiple bands of adhesive, the sealing-glass bands and the adhesive bands being disposed so as to extend concentrically around a periphery of the first main surface, and
- the second sealing material comprises multiple bands of sealing glass and multiple bands of adhesive, the sealing-glass bands and the adhesive bands being disposed to extend concentrically around a periphery of the second main surface.

10. The device of claim 9, wherein:
- the sealing-glass bands and the adhesive bands of the first sealing material are disposed on the first main surface of the frame body in alternating order from nearest the piezoelectric vibrating piece outward; and
- the sealing-glass bands and the adhesive bands of the second sealing material are disposed on the second main surface of the frame body in alternating order from nearest the piezoelectric vibrating piece outward.

11. The device of claim 10, wherein, in the first and second sealing materials, the band situated nearest the piezoelectric vibrating piece is a respective sealing-glass band.

12. The device of claim 9, wherein, in the first and second sealing materials, the band situated nearest the piezoelectric vibrating piece is a respective sealing-glass band.

13. The device of claim 9, wherein:
- the adhesive is a polyimide resin; and
- the polyimide resin has a curing temperature in a temperature range similar to a range of melting temperature of the sealing glass.

14. The device of claim 9, wherein each sealing-glass band comprises a low-melting-point glass having a melting point lower than a melting point of the first plate or of the second plate.

15. The device of claim 9, wherein:
- each sealing material includes at least one gap, situated between a respective sealing-glass band and a respective adhesive band;
- in the gap substantially no sealing glass or adhesive is present.

16. The device of claim 4, wherein each band of sealing glass is formed by mask-printing and each band of adhesive is formed by photolithography.

* * * * *

UNITED STATES PATENT AND TRADEMARK OFFICE
CERTIFICATE OF CORRECTION

PATENT NO. : 8,405,282 B2  
APPLICATION NO. : 13/117600  
DATED : March 26, 2013  
INVENTOR(S) : Mitoshi Umeki Page 1 of 1

It is certified that error appears in the above-identified patent and that said Letters Patent is hereby corrected as shown below:

In the Specification:

Column 8, line 37, "foamed by" should read --formed by--

In the Claims:

Column 13, line 7, claim 9, "foamed integrally" should read --formed integrally--

Signed and Sealed this  
Ninth Day of September, 2014

Michelle K. Lee  
*Deputy Director of the United States Patent and Trademark Office*